United States Patent [19]

Lee

[11] Patent Number: 5,397,907
[45] Date of Patent: Mar. 14, 1995

[54] FIELD EFFECT TRANSISTOR AND FABRICATING METHOD THEREOF

[75] Inventor: Yong H. Lee, Suwon, Rep. of Korea

[73] Assignee: Samsung Electronics Co., Ltd., Kyungki-do, Rep. of Korea

[21] Appl. No.: 223,781

[22] Filed: Apr. 6, 1994

Related U.S. Application Data

[62] Division of Ser. No. 33,745, Mar. 18, 1993.

[51] Int. Cl.$^6$ .................. H01L 29/48; H01L 29/56; H01L 29/64
[52] U.S. Cl. .................. 257/280; 257/472; 257/618; 257/622; 257/284; 257/286
[58] Field of Search ............ 257/276, 410, 192, 284, 257/286, 472, 619, 622, 280, 618

[56] References Cited

U.S. PATENT DOCUMENTS 5,274,257  12/1993  Kim et al. .................. 257/284

FOREIGN PATENT DOCUMENTS 0286348  10/1988  European Pat. Off. .......... 257/330

*Primary Examiner*—Jerome Jackson
*Assistant Examiner*—John F. Guay
*Attorney, Agent, or Firm*—Robert A. Westerlund; Stephen R. Whitt; Charles R. Donohoe

[57] ABSTRACT

A MESFET which includes a semi-insulating substrate, e.g., a GaAs substrate, an insulating layer formed on a portion of the upper surface of the substrate, a first semiconductor layer formed on the upper surface of the substrate adjacent to opposite sides of the insulating layer, the first semiconductor layer having sidewalls defining a void therein, a nitride layer formed on a portion of the upper surface of the insulating layer, an oxide layer formed on the nitride layer, a second semiconductor layer formed on the sidewalls of the first semiconductor layer and in covering relationship to the void, a gate electrode formed on at least a portion of the upper surface of the second semiconductor layer, and, source and drain electrodes formed on the upper surface of the first semiconductor layer, on opposite sides of the gate electrode.

18 Claims, 2 Drawing Sheets

FIELD EFFECT TRANSISTOR AND FABRICATING METHOD THEREOF

This is a division of application Ser. No. 08/033,745, filed Mar. 18, 1993.

BACKGROUND OF THE INVENTION

The present invention relates generally to compound semiconductor field effect transistors (FETs), and, more particularly, to a MESFET having an epitaxial void.

MESFETs have been developed in order to overcome the inherent limitations of metal oxide FETs (MOSFETs) fabricated in silicon chips, particularly with respect to operating speed. Because GaAs and other semi-insulating or compound semiconductor materials have a much higher electron mobility than silicon, MESFETs are capable of much higher operating speeds than MOSFETs.

With reference now to FIG. 1, a conventional delta-doped MESFET ($\delta$-MESFET) will now be described. The conventional $\delta$-MESFET includes a semi-insulating GaAs substrate 10, an undoped or p-type GaAs buffer layer 12, a delta-doped Si channel monolayer 14, and an undoped GaAs spacer layer 16, n+ type source and drain regions 18 formed in the surface of the p-type buffer layer 12, source and drain electrodes, 15, 17, formed on the source and drain regions 18, and a gate electrode 13 formed in Schottky contact with the spacer layer 16 between the source and drain electrodes 15, 17.

A gate voltage applied to the gate electrode 13 and bias voltages applied to the source and drain electrodes 15, 17 govern the thickness of a depletion region formed in the channel layer 14, and thus the current flowing through the channel of the MESFET between the source and drain thereof.

In the fabrication of the conventional MESFET, the gate electrode 13 is formed by means of a conventional photolithographic process. Consequently, conventional MESFETs often have misaligned gates and unduly high channel resistances. Further, because the buffer layer 12 is formed to suppress leakage current, the impurity concentration thereof is low, (e.g., $10^{14}$ ions/cm.$^2$), thereby further increasing the channel resistance and threshold voltage of the conventional MESFET. Moreover, because of the difficulties inherent in the process for fabricating the conventional MESFET, the buffer layer 12 is not effective to eliminate the backgating effect due to the voltage difference between the substrate and an electrode of a neighboring transistor, which problem is exacerbated when the electric field in the channel layer increases and/or the voltage applied to the neighboring electrode increases.

Based on the foregoing, it can be appreciated that there presently exists a need in the art for a MESFET which overcomes the above-described drawbacks and shortcomings of the conventional MESFETs. The present invention fulfills this need.

SUMMARY OF THE INVENTION

The present invention encompasses a MESFET which includes a semi-insulating substrate, e.g., a GaAs substrate, an insulating layer formed on a portion of the upper surface of the substrate, a first semiconductor layer formed on the upper surface of the substrate adjacent to opposite sides of the insulating layer, the first semiconductor layer having sidewalls defining a void therein, a nitride layer formed on a portion of the upper surface of the insulating layer, an oxide layer formed on the nitride layer, a second semiconductor layer formed on the sidewalls of the first semiconductor layer and in covering relationship to the void, a gate electrode formed on at least a portion of the upper surface of the second semiconductor layer, and, source and drain electrodes formed on the upper surface of the first semiconductor layer, on opposite sides of the gate electrode.

DETAILED DESCRIPTION OF THE INVENTION

FIGS. 2A to 2F are cross-sectional views in each step of fabricating a MESFET with void structure according to an embodiment of the present invention.

Figure 2B:
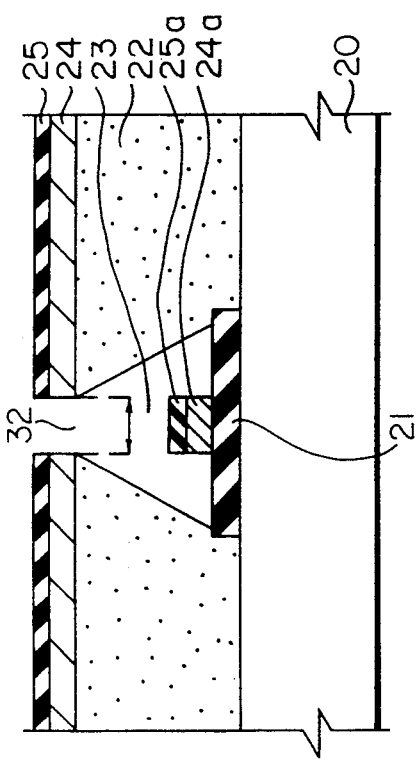
FIGS. 2A to 2F illustrate processing steps for fabricating a MESFET according to an embodiment of the present invention.
Figure 1:
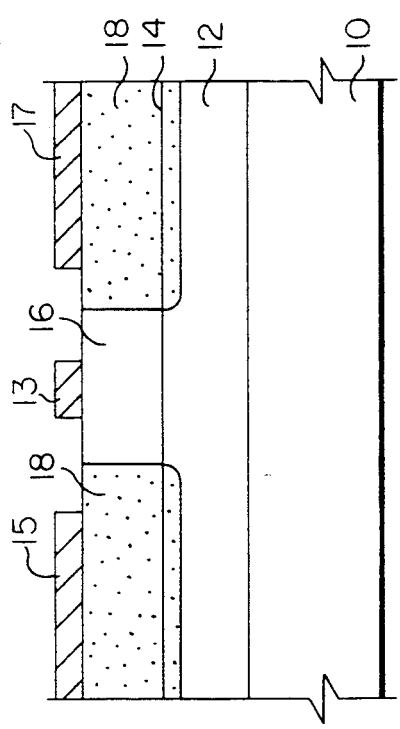
FIG. 1 illustrates a cross-sectional view of a conventional MESFET.
Figure 2A:
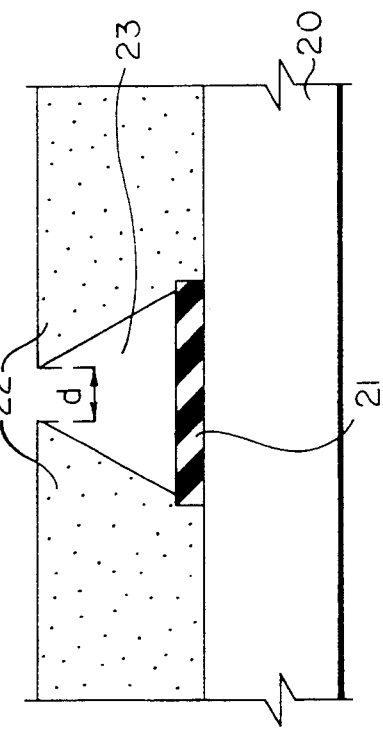
Figure 2C:
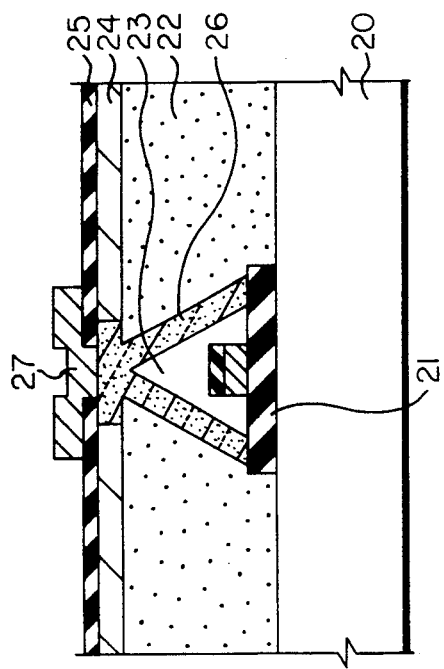
Figure 2D:
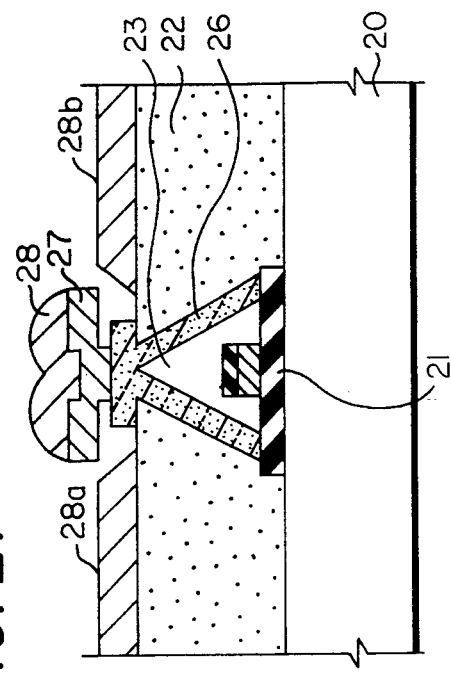
Figure 2E:
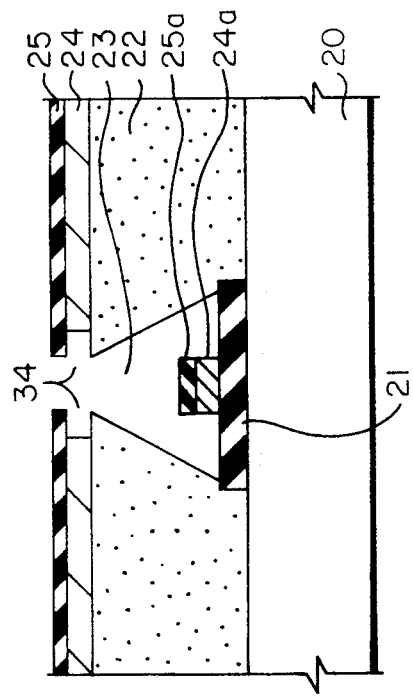
Figure 2F:
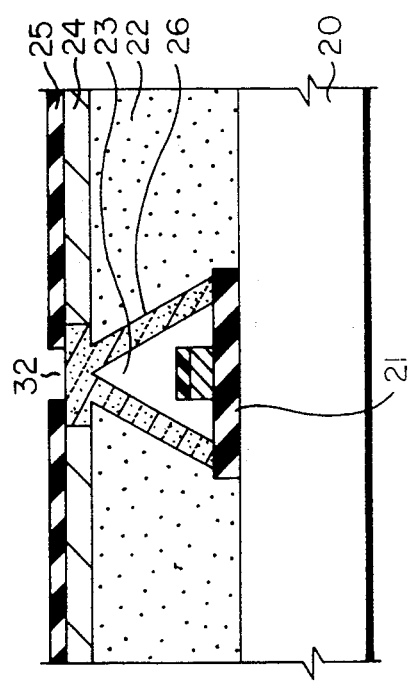

With reference now to FIG. 2F, a preferred embodiment of a MESFET constructed in accordance with the present invention will now be described. An insulating layer 21 is formed on a semi-insulating GaAs substrate 20 with a crystal orientation of (001), tilted as such as 20°~30° from <$\bar{1}$10> direction. This insulating layer 21 is formed of either of $SiO_2$ and $Si_3N_4$, and has a thickness of 0.05~0.1 $\mu$m and a width of 1.0~2.0 $\mu$m. N+ type GaAs layers 22 having a thickness of 0.3~0.8 $\mu$m are formed on the GaAs substrate 20. A triangle-shaped void 23 is formed on the insulating layer 21. The top of the void 23 is opened with a distance between pointed ends of 0.5~1.5 $\mu$m. Also these n+ type GaAs layers 22 become source and drain regions of the MESFET. The void 23 is formed in the inside of the n+ type GaAs layers 22 so that the n+ type GaAs layers 22, i.e., source and drain regions are separated from each other. As n type channel layer 26 is formed on the n+ type GaAs layers 22 having the void structure therein. This channel layer 26 is formed over the entire slopes of the void 23. A T-shaped gate electrode 27 is formed in shottky contact on the channel layer 26 and an ohmic metal 28 with high conductivity is laid on this gate electrode 27. Also, source and drain electrodes 28a and 28b are formed in ohmic contact on the n+ type GaAs layers 22 at both sides of the gate electrode 27.

In the MESFET having the structure described above, the void 23 completely separates the channel layer 26 and the semiconductor substrate 20 electrically from each other. Thus, this void 23 excludes the possibility of generation of voltage difference between the semiconductor substrate 20 and the neighboring electrode not shown. That is to say, forming an unnecessary depletion region between the channel 26 and the substrate 20 is prevented, thereby eliminating the backgating effect.

The process for fabricating the MESFET depicted in FIG. 2F will now be described with reference to FIGS. 2A–2F.

Referring to FIG. 2A, first, the insulating layer 21 of $SiO_2$ or $Si_3N_4$ is deposited with a thickness of 0.05~0.1 $\mu$m on the semi-insulating GaAs substrate 20 having a crystal orientation of (100). After that the insulating layer 21 having a width of 1.0~2.0 $\mu$m is formed by the photolithography process, tilted as much as 20°~30° from <$\bar{1}10$> direction of the GaAs substrate 20. The width of the insulating layer 21 determines the height of the void formed in the next process. Subsequently, the n+ type GaAs layers 22, i.e., the source and drain regions are formed by the selective MOCVD method on the top of the GaAs substrate 20 where the insulating layer 21 is not formed, having a tilting angle of 20°~30° from <$\bar{1}10$> direction. At that time, the triangular-shaped void is formed in the inside of the n+ type GaAs layers 22 so that two separated GaAs layers are formed. That is to say, since the insulating layer 21 is used as a mask in the selective MOCVD process, the n+ type GaAs layers 22 are formed not on the insulating layer 21 but on the GaAs substrate 20. A distance "d" between the pointed ends at the top of the void is about 0.5~1.5 $\mu$m. The thickness of the n+ type GaAs layers 22 is about 0.3~0.8 $\mu$m.

Referring to FIG. 2B, a nitride layer 24 and an oxide layer 25 are formed on the structure by the conventional sputtering method. Since the layer is vertically grown on the plane of the structure by the sputtering method, the nitride layer 24a and the oxide layer 25a are left inside the void 23 and an oxide open hole part 32 having a size corresponding to a distance "d" between the pointed ends of the void 23 is formed on the n+ type GaAs layers 22. The thickness of the nitride layer 24 determines the thickness of the channel layer 26 described later and has to be chosen properly, considering the characteristics of the device. A thickness of the nitride layer 24 is preferable to be about 0.1~0.3 $\mu$m.

Referring to FIG. 2C, if an isotropic etching is carried out by a dry etching method, a nitride open hole part 34 under the oxide layer 25 is etched wider than the oxide open hole part 32. This is possible because the nitride layer 24 has a sufficiently large etching selectivity ratio over the oxide layer 25. In other words, the nitride layer 24 is etched 3~5 times faster than the oxide layer 25. The width of the etched nitride open hole part 34 determines the length of the channel layer and is about 0.1~0.3 $\mu$m in both directions. The etched oxide open hole part 32 determines the length of the gate. The channel and gate are to be described later.

Referring to FIG. 2D, an n type GaAs layer, i.e., the channel layer 26 is formed by the selective MOCVD method. The channel layer 26 is formed over the entire surface of the inverse slopes of the void formed by the n+ type GaAs layers 22. The selective growth is continued until the distance "d" between the pointed ends of the void 23 is filled according to the progress of crystal growth and the nitride open hole part 34 is fully filled. To see the resultant structure after forming the channel layer 26, the channel layer 26 is filled into the nitride open hole part 34 and is exposed through the oxide open hole part 32.

Referring to FIG. 2E, the T-shaped gate electrode 27 is formed by depositing Ti/Pt/Au, Al or Pt on the oxide layer 25 and the channel layer 26 and patterning it. Here, the gate electrode 27 is formed in shottky contact on the channel layer 26 by self-alignment through the oxide open hole part 32. Thus, the gate electrode 27 can be laid on the oxide open hole part 32. Thus, the gate electrode 27 can be laid on the channel layer 26 without misalignment. As mentioned earlier, since the length of the gate electrode 27 is determined by the width of the oxide open hole part 32, it is easy to form a short effective gate length which is very important in determining the characteristics of the device. Also, the gate electrode 27 is formed in a T shape by self-alignment on the process. The T-shaped gate structure does not cause the parasitic capacitance and also forms the gate wider.

Referring to FIG. 2F, by removing the nitride layer 24 and the oxide layer 25 and then depositing AuGe/Ni/Au on the structure, the source and drain electrodes 28a and 28b are formed on the n+ type GaAs layers 22 at both sides of the gate electrode 27 as well as on the top of the gate electrode 27. Also, the present invention is described only for an example of GaAs with (100) orientation but the substrate can have (001) or (010) orientation and it also can be other compound semiconductors such as InP and GaP.

The present invention described heretofore forms the source and drain regions on the semi-insulating semiconductor substrate having the insulating layer by using the crystal growth according to the crystal direction and electrically separates the channel form the substrate by forming the channel layer and the self-aligned gate electrode sequentially on the top of the void formed by the source and drain regions. Thus, the present invention achieves a high-speed MESFET by suppressing the leakage current and the backgating effect without forming a buffer layer, forming the gate electrode without misalignment, and reducing the effective gate length and the gate resisitivity.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What is claimed is:

1. A MESFET, comprising:
   a semi-insulating substrate;
   an insulating layer formed on a portion of a major surface of said semi-insulating substrate;
   a first semiconductor layer formed on said major surface of said semi-insulating substrate adjacent to opposite sides of said insulating layer, said first semiconductor layer having inversely sloped sidewalls defining a void therein, said sidewalls extending from an upper surface of said first semiconductor layer to an upper surface of said insulating layer;
   a nitride layer formed on a portion of said upper surface of said insulating layer;
   an oxide layer formed on said nitride layer;
   a second semiconductor layer formed on said sidewalls of said first semiconductor layer and in covering relationship to said void;
   a gate electrode formed on at least a portion of a surface of said second semiconductor layer; and,
   source and drain electrodes formed on said upper surface of said first semiconductor layer on opposite sides of said gate electrode.

2. The MESFET as set forth in claim 1, wherein said major surface of said semi-insulating substrate is oriented at a prescribed angle to a <110> crystalline plane of said substrate.

3. The MESFET as set forth in claim 2, wherein said prescribed angle is between 20°-30°.

4. The MESFET as set forth in claim 3, wherein said void is generally triangular in cross-section.

5. The MESFET as set forth in claim 4, further comprising an ohmic contact formed on a surface of said gate electrode.

6. The MESFET as set forth in claim 1, wherein said first semiconductor layer comprises an epitaxially deposited semiconductor layer.

7. The MESFET as set forth in claim 2, wherein said first semiconductor layer comprises an epitaxially deposited semiconductor layer.

8. The MESFET as set forth in claim 7, wherein said insulating layer is made of a material selected from a group consisting of $SiO_2$ and $Si_3N_4$.

9. The MESFET as set forth in claim 3, wherein said void has a minimum diameter of between 0.5–1.0 microns.

10. The MESFET as set forth in claim 1, wherein said insulating layer has a width of between 1–2 microns.

11. The MESFET as set forth in claim 1, wherein said gate electrode is generally T-shaped.

12. The MESFET as set forth in claim 1, wherein said gate electrode is in schottky contact with said second semiconductor layer.

13. The MESFET as set forth in claim 1, wherein said semi-insulating substrate is made of a material selected from a group consisting of GaAs, InP, and GaP.

14. The MESFET as set forth in claim 13, wherein said first semiconductor layer is made of N+ type GaAs.

15. The MESFET as set forth in claim 13, wherein said second semiconductor layer is made of N type GaAs.

16. The MESFET as set forth in claim 6, wherein said second semiconductor layer comprises an epitaxially deposited semiconductor layer.

17. The MESFET as set forth in claim 1, wherein the thickness of said nitride layer is between 0.1–0.3 microns.

18. The MESFET as set forth in claim 1, wherein the width of said nitride and oxide layers is approximately the same as the minimum diameter of said void.

* * * * *